United States Patent [19]

Yang

[11] Patent Number: 5,442,214
[45] Date of Patent: Aug. 15, 1995

[54] VDMOS TRANSISTOR AND MANUFACTURING METHOD THEREFOR

[75] Inventor: Sheng-Hsing Yang, Hsinchu, Taiwan

[73] Assignee: United Microelectronics Corp., Hsin-Chu, Taiwan

[21] Appl. No.: 330,567

[22] Filed: Oct. 28, 1994

Related U.S. Application Data

[62] Division of Ser. No. 287,950, Aug. 9, 1994.

[51] Int. Cl.$^6$ .............................................. H01L 29/68
[52] U.S. Cl. .................................... 257/328; 257/332; 257/333; 257/335; 257/336; 257/345
[58] Field of Search ............... 257/328, 332, 333, 335, 257/336, 345

[56] References Cited

U.S. PATENT DOCUMENTS 5,298,781  3/1994  Cogan et al. ..................... 257/333

Primary Examiner—Edward Wojciechowicz
Attorney, Agent, or Firm—Ladas & Parry

[57] ABSTRACT

A VDMOS transistor having a reduced drain/source resistance without a corresponding decrease in breakdown voltage and a manufacturing method therefor. Such a VDMOS transistor is created by gradually increasing the doping density of the transistor's implanted regions, while simultaneously increasing the respective thicknesses of the gate oxide layers corresponding to the implanted regions along the current flow path.

5 Claims, 19 Drawing Sheets

VDMOS TRANSISTOR AND MANUFACTURING METHOD THEREFOR

This is a divisional of co-pending application Ser. No. 08/287,950 filed Aug. 9, 1994.

FIELD OF THE INVENTION

The present invention relates to double diffused metal-oxide-semiconductor (DMOS) transistors, and in particular to a vertical DMOS transistor having a lower drain-source resistance and method of forming the same.

BACKGROUND OF THE INVENTION

FIG. 1a shows the cross section of a conventional vertical DMOS (VDMOS) transistor 10. A conventional VDMOS transistor 10 has a N+ drain electrode 11 below a lightly doped N− region 12. Within the N− region 12 is a pair of P-type regions 13a and 13b. Each of the P type regions 13a and 13b respectively has a N type source region, 15a and 15b. A polysilicon gate electrode 17 is located above a portion of the N− region 12 overlapping both the P type regions 13a and 13b and the source electrodes 15a and 15b, with a dielectric layer 18 provided between the polysilicon gate electrode 17 and the aforementioned regions. When the drain electrode 11 is grounded and the voltage at the source electrodes 15a and 15b is higher than a threshold voltage, a current 19 is permitted to flow between the source electrodes and the drain electrode. The path of the current is shown by arrows 19 and is both horizontal and vertical.

FIG. 1b shows another type of conventional VDMOS transistor 20 which has a gate electrode 27 located in a trench. Current flows vertically from source electrodes 25a and 25b to a drain electrode 11 as shown by arrows 29.

Comparing the above-described conventional VDMOS transistors 10 and 20, transistor 10 consumes more electricity because the current 19 flows a longer distance in the lightly doped N− region 12, which results in a larger source/drain resistance. As may be readily appreciated, the transistor 20 is more efficient because it has a shorter current path. Although the trenched structure of transistor 20 reduces the source/drain resistance, both of the conventional VDMOS devices 10 and 20 have a deficiency in that their source/drain resistances and breakdown voltages decrease when the doping density of their respective N− regions are increased. As a result, high breakdown voltage and low source/drain resistance can not be achieved simultaneously.

SUMMARY OF THE INVENTION

It is therefore an object for the present invention to reduce the source/drain resistance of VDMOS transistors while maintaining a high breakdown voltage.

The object of the present invention is fulfilled by providing a method for fabricating a VDMOS transistor on a substrate of a first conductivity type. A preferred method comprises the steps of: (a) forming a drain electrode region of the first conductivity type in the substrate, the drain electrode region having a drain electrode region doping density; (b) forming an epitaxial layer of the first conductivity type on the drain electrode region, the epitaxial layer having an epitaxial layer doping density less than the doping density of the drain electrode region; (c) forming a body region of a second conductivity type on the epitaxial layer; (d) forming a source electrode region of the first conductivity type in the body region; (e) forming a trench through the source electrode region and the body region, to reach the epitaxial layer; (f) implanting impurities of the first conductivity type into the bottom surface of the trench to form an implanted region having an implanted region doping density; (g) thermally diffusing the impurities in the step (f) and forming an oxide layer in the trench; (h) forming a silicon nitride layer on the oxide layer in the step (g); (i) etching the bottom of the trench to reach the epitaxial layer; (j) implanting impurities of the first conductivity type into the bottom of the trench to form another implanted region having a doping density larger than the doping density of the implanted region in the step (f); (k) thermally diffusing the impurities in the step (j) and forming an oxide layer on the bottom of the trench; (l) repeating the steps (i) to (k) with a continuously increased doping density of the implanted region in the step (j) at least once; (m) forming a gate electrode in the trench; (n) forming another oxide layer on the substrate; (o) forming predetermined metal vias in the oxide layer of the step (n); and (p) forming predetermined metal contacts and wiring.

BRIEF DESCRIPTION OF THE DRAWING

The present invention is more fully understood from the detailed description provided hereinafter with reference to the accompanying drawings which are given by way of illustration only, and thus not limitative of the present invention and wherein.

DETAILED DESCRIPTION OF THE PREFERRED EMBODIMENT

The fabrication of a transistor 30 according to a first embodiment of the present invention is illustrated in FIGS. 2a to 2l and described hereinafter.

EMBODIMENT 1

Step 1

Figure 1A:
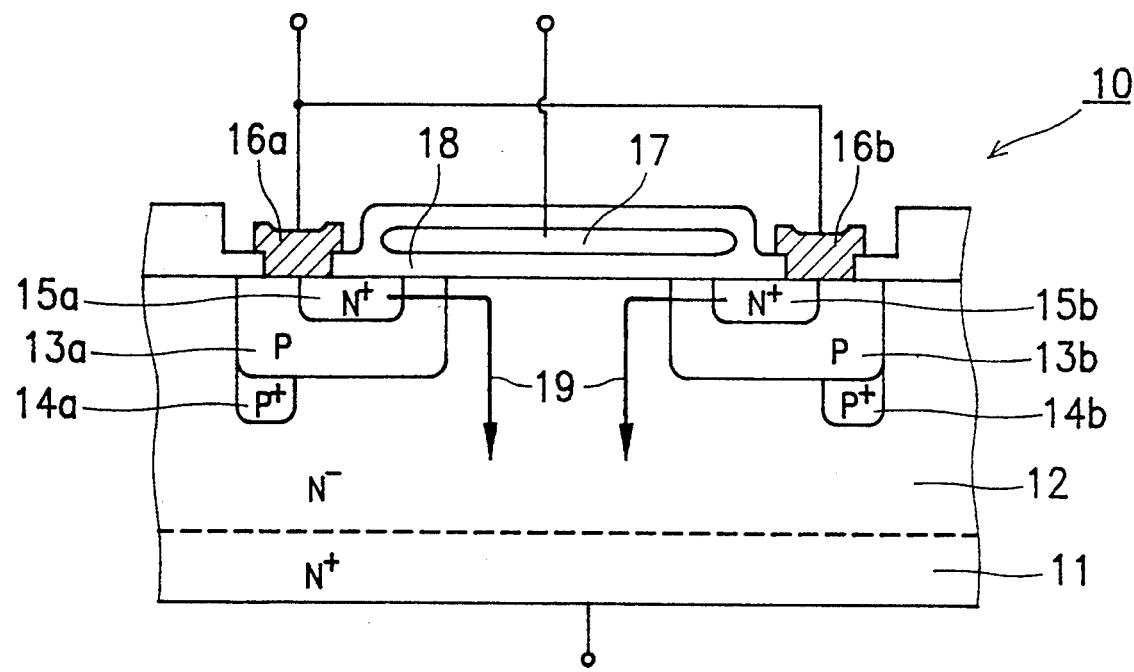
FIGS. 1a and 1b are cross sectional views of two kind of conventional vertical DMOS (VDMOS) transistors.
Figure 1B:
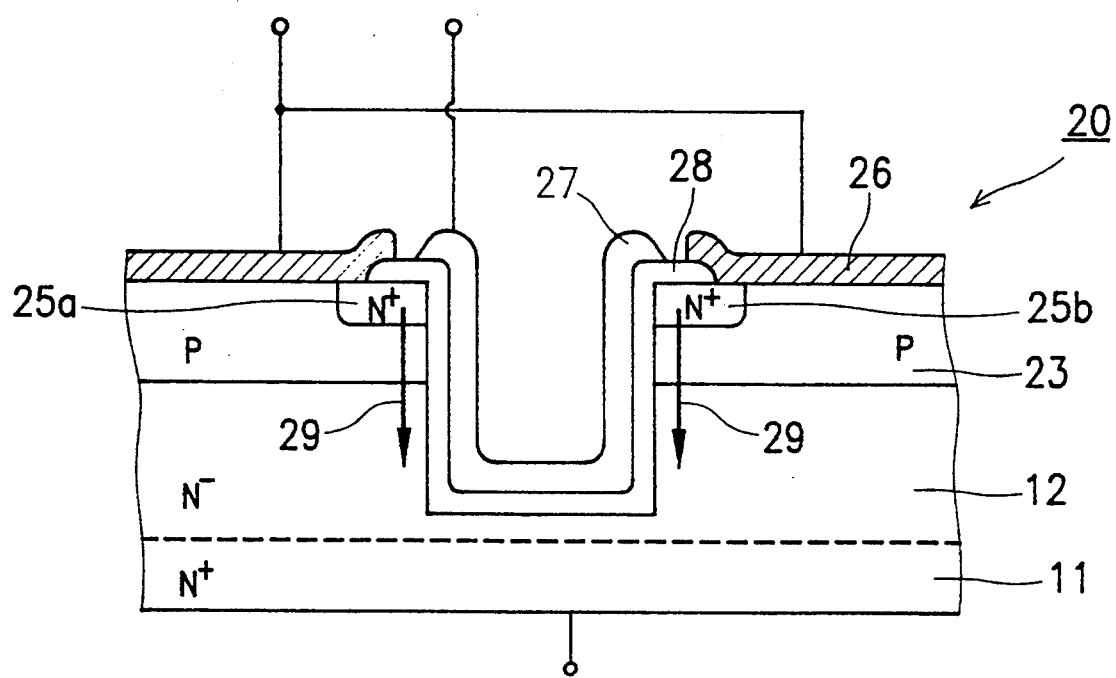
Figure 2A:
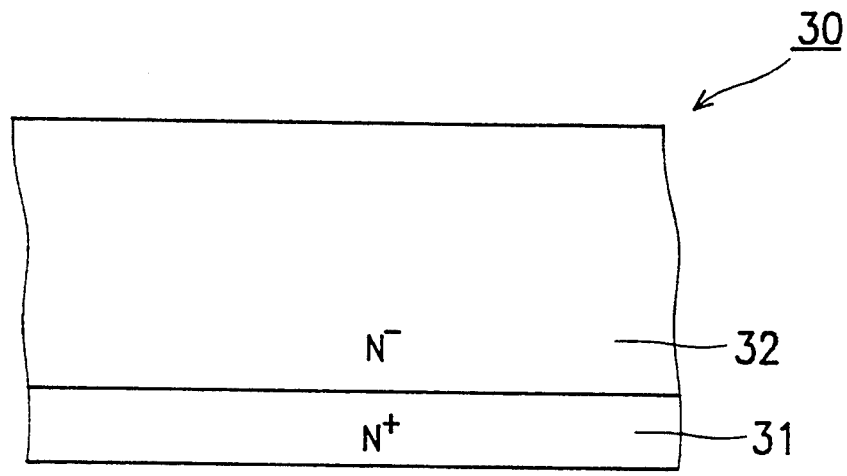
FIGS. 2a to 2l are cross-sectional views of a first embodiment of the VDMOS transistor according to the present invention during various steps in its formation.

FIG. 2a shows a N+ substrate 31 which has a coefficient of electrical resistivity between 0.005 and 0.1 Ω-cm. A N−epitaxial layer 32 with a thickness from 8 to 100 μm and a coefficient of electrical resistivity between 0.1 and 100 Ω-cm is grown over the N+ substrate 31 by conventional epitaxial growth techniques.

Step 2

Figure 2B:
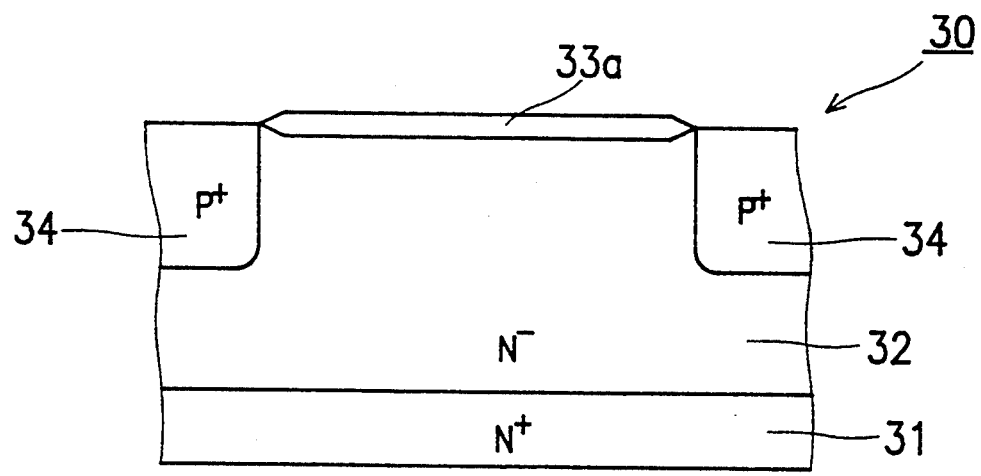

FIG. 2b shows an oxide layer 33a which is formed by thermally oxidizing the surface of the N− epitaxial layer 32. Next, the oxide layer 33a is patterned using conventional lithographic techniques and boron ($B^{11}$) ions with a kinetic energy of 30 to 120 KeV are implanted into the N− epitaxial layer 32, to form P+ regions 34 with a dosage of $5 \times 10^{13}$ to $1 \times 10^{16}$ atoms/cm$^2$.

Step 3

Figure 2C:
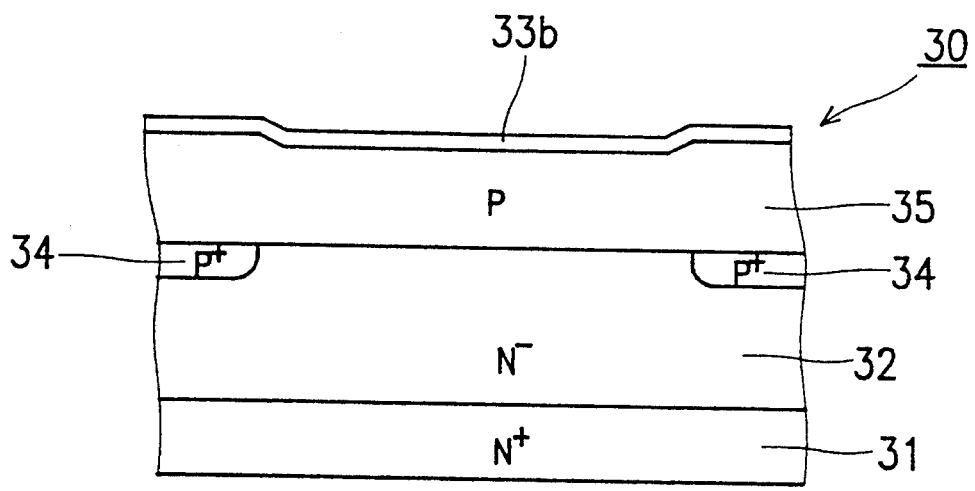

The oxide layer 33a is then removed by etching, as shown in FIG. 2c. Thereafter, boron (B$^{11}$) ions at 30 to 120 KeV with a dosage of $1 \times 10^{13}$ to $1 \times 10^{14}$ atoms/cm$^2$ are implanted into the upper surface of the N− epitaxial layer 32 to form a body region 35. The substrate is then heated and the body region 35 is diffused to a predetermined body region depth of 3 to 4 μm in the N− epitaxial layer 32 with another oxide layer 33b being simultaneously formed at the upper surface of the body region 35.

Step 4

Figure 2D:
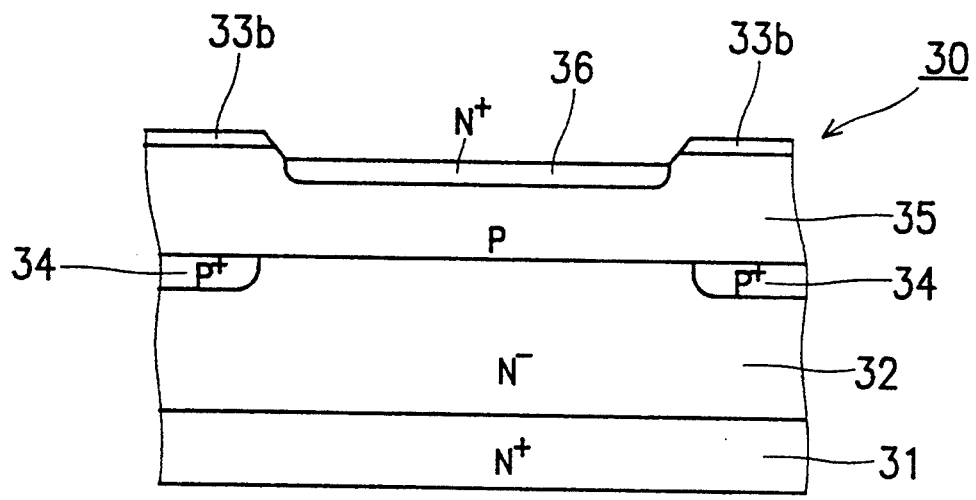

As is shown in FIG. 2d, the oxide layer 33b is then patterned using conventional lithographic techniques. Phosphorus (p$^{31}$) ions or arsenic (As$^{51}$) ions at 50 to 150 KeV are thereafter implanted into the body region 35 with a dosage of $1 \times 10^{15}$ to $1 \times 10^{16}$ atoms/cm$^2$ to form a source region 36 to a predetermined source region depth which is less than the predetermined body region depth of 3–4 μm.

Step 5

Figure 2E:
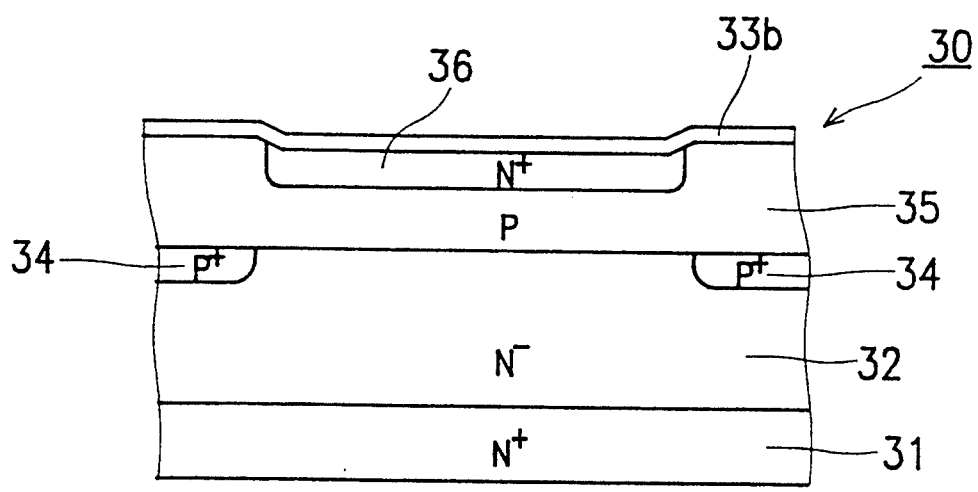

FIG. 2e shows that the source region 36 is then thermally diffused into the body region 35 with an oxide layer having a thickness of 1 to 2 μm being simultaneously formed thereon.

Step 6

Figure 2F:
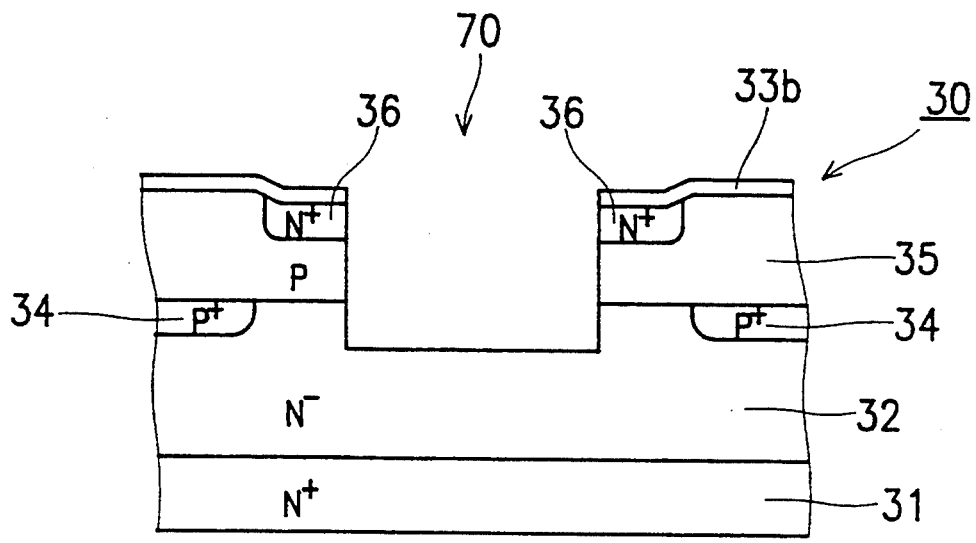

A trench 70 is thereafter formed by conventional lithographic techniques using a trench mask and reactive ion etching (RIE) to etch to a predetermined first trench depth of 4 to 5 μm into the N− epitaxial layer 32 as shown in FIG. 2f.

Step 7

Figure 2G:
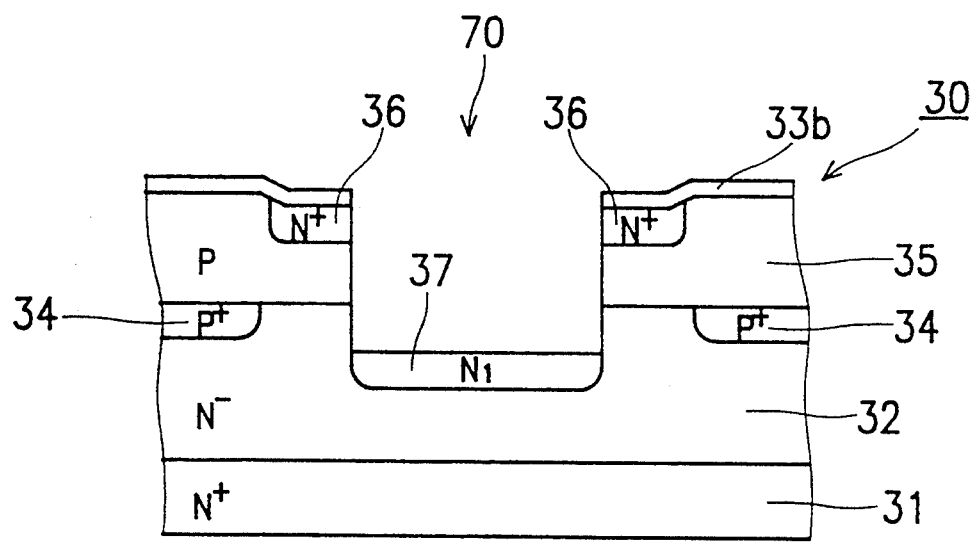
Figure 2H:
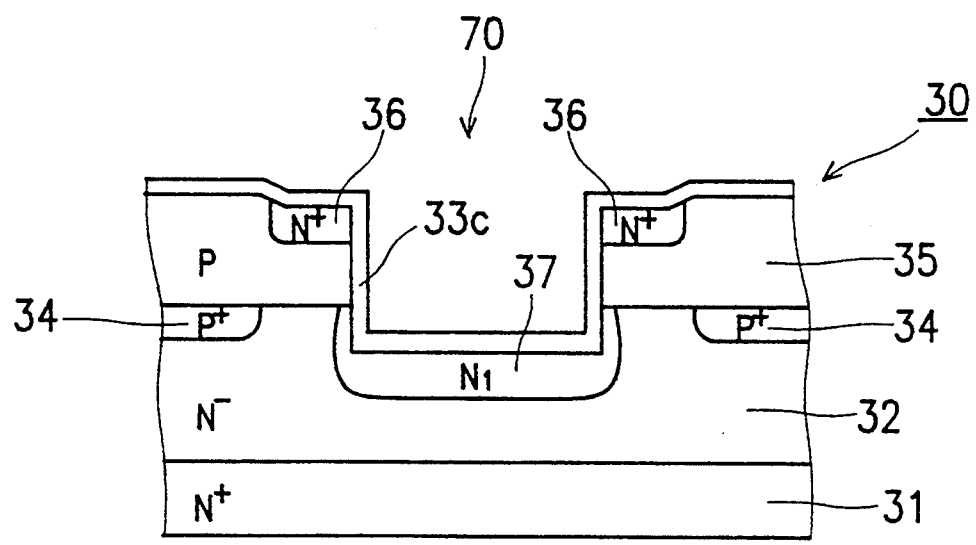

FIG. 2g shows that phosphorous (p$^{31}$) ions or arsenic (As$^{51}$) ions are then implanted into the bottom of the trench 70, to form a first N type implanted region 37. The substrate is thereafter heated to grow a first gate oxide layer 33c and to drive the phosphorus or arsenic ions into the bottom of the trench as shown in FIG. 2h. The substrate is then annealed. The doping density of the first N type implanted region 37 is higher than the doping density of the N− epitaxial layer 32.

Step 8

Figure 2I:
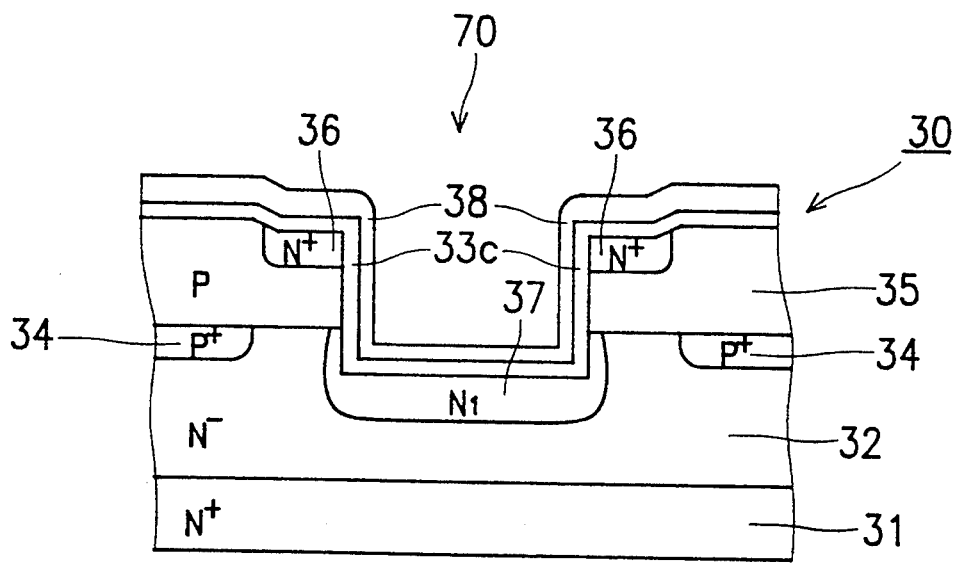

FIG. 2i shows a silicon nitride layer 38 which is then deposited on the gate oxide layer 33c by chemical vapor deposition (CVD).

Step 9

Figure 2J:
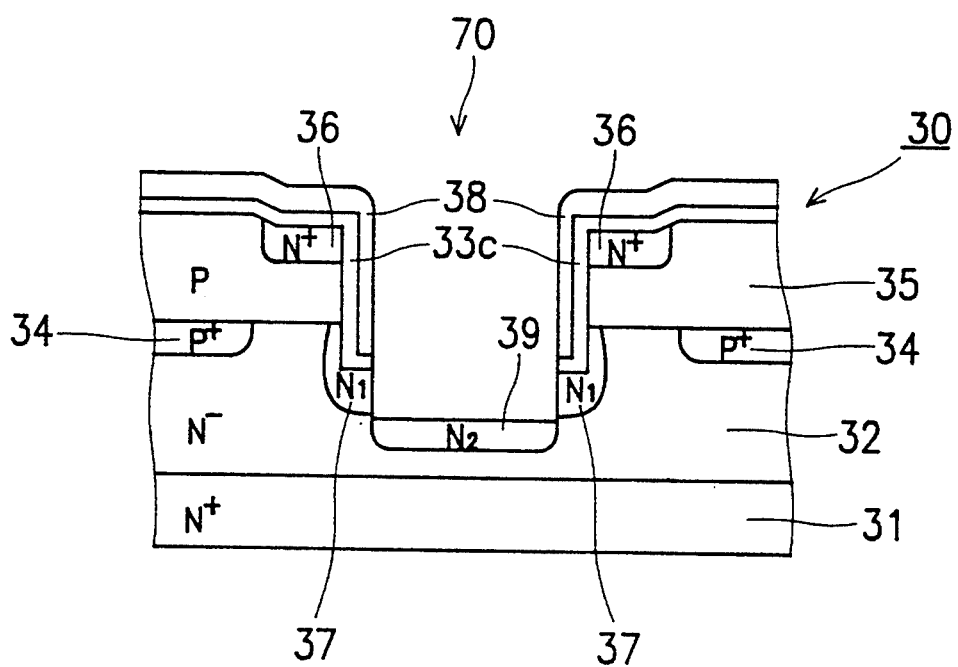

As shown in FIG. 2j, the bottom of the trench 70 is again etched by RIE (effectively creating a narrower and deeper second trench within the original trench 70) and then phosphorus (p$^{31}$) ions or arsenic (As$^{51}$) ions are again implanted into the bottom of the trench 70 to form a second N type implanted region 39. The doping density of the second N type implanted region 39 is higher than the doping density of the first N type implanted region 37. The doping density of the second N type implanted region 39 is lower than the doping density of the N+ substrate 31.

Step 10

Figure 2K:
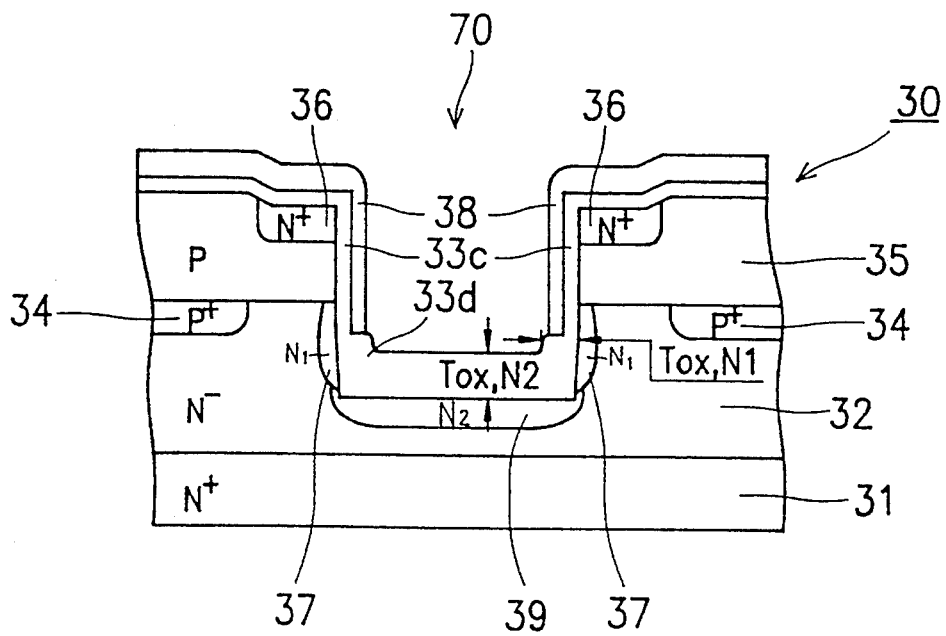

The substrate is then heated to form a second gate oxide layer 33d while simultaneously diffusing the phosphorus or arsenic ions in the second N type implanted region 39. The thickness of the second gate oxide layer 33d, as is best illustrated in FIG. 2k, is greater than the thickness of the first gate oxide layer 33c.

Step 11

Figure 2L:
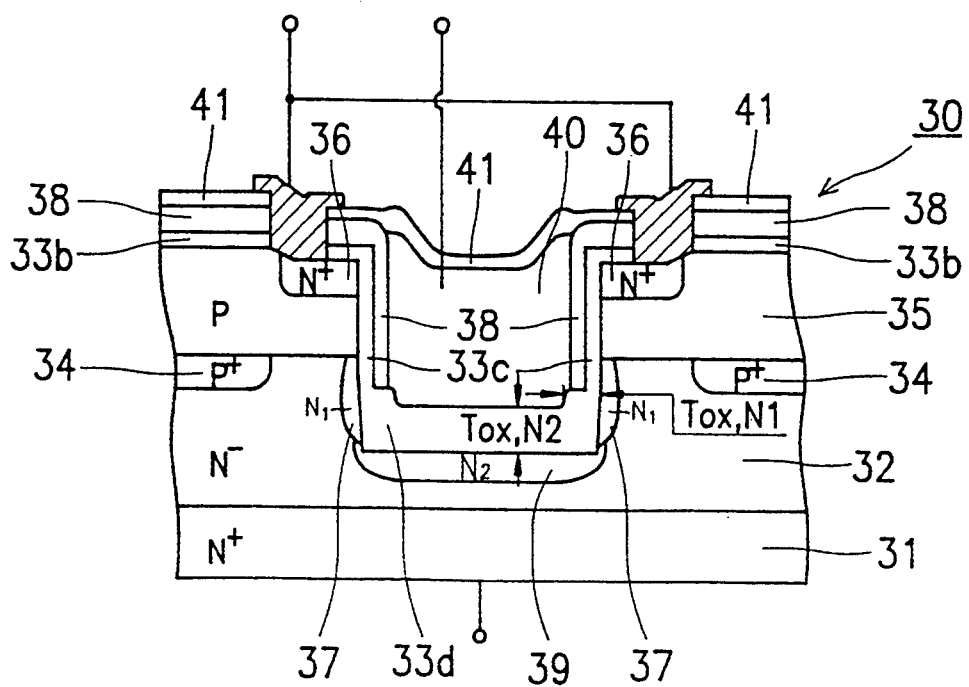

Finally, FIG. 2l shows a poly gate 40 which is formed in the trench 70 by depositing polysilicon on the substrate and then etching the portion of polysilicon that is not in the trench 70. An oxide layer 41 is thereafter formed by CVD on the substrate. Then metal vias and metal contacts and wiring are formed by conventional lithographic techniques.

As discussed previously, the source/drain resistance is reduced when the doping density is increased in the current flow path. In a conventional VDMOS transistor, the doping density in the current flow path is always N−. In the VDMOS transistor according to the present invention, the relationship of the doping density in the current flow path in different areas of the transistor is:

$$N- < N_1 < N_2 < N+$$

wherein:

N− is the doping density of the N− epitaxial layer;

$N_1$ is the doping density of the first N-type implanted region;

$N_2$ is the doping density of the second N-type implanted region; and

N+ is the doping density of the N+ substrate. Accordingly, the source/drain resistance of the present invention is lower than that of prior art VDMOS transistors.

Furthermore, the conventional decrease in the breakdown voltage, which is associated with a reduction in the source/drain resistance, is prevented by increasing the thickness of the gate oxide layer. In particular, it has been observed that as the doping density increases, an increase in the thickness of the gate oxide layer prevents the above-described decrease in the breakdown voltage. In summary, the VDMOS transistor of the first embodiment does not experience the conventional reduction in a breakdown voltage where the doping density is increased because the doping density of the second N type implanted region 39 is higher than the doping density of the first N type implanted region 37, and thickness of the gate oxide layer on the second N type implanted region 39 is greater than that of the first N type implanted region 37.

The fabrication of a transistor 50 according to a second embodiment of the present invention is illustrated in FIGS. 3a to 3f and described hereinafter.

EMBODIMENT 2

Step 1

Figure 3A:
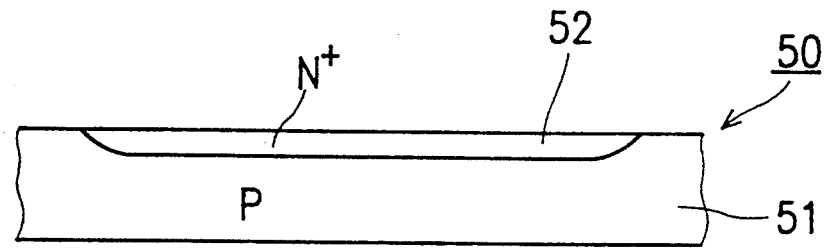
FIGS. 3a to 3f are cross-sectional views of a second embodiment of the VDMOS transistor according to the present invention during various steps in its formation.

FIG. 3a shows the implantation of N type impurities into a P type substrate 51 to form a N+ type buried layer 52.

Step 2

Figure 3B:
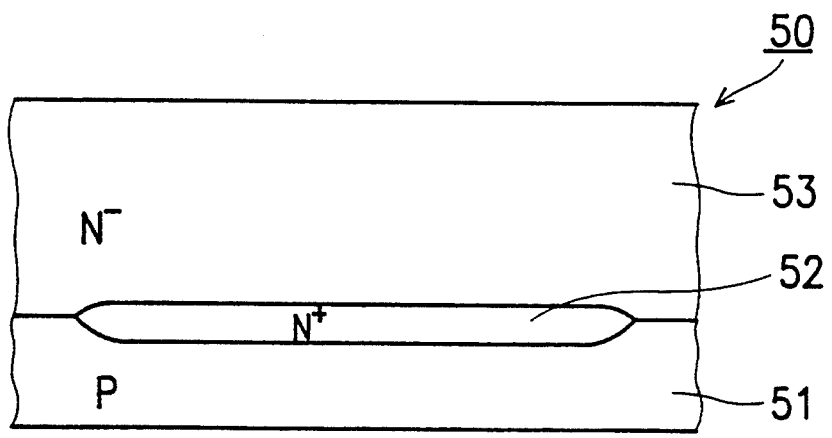

As shown in FIG. 3b, a N− epitaxial layer 53 with a thickness from 8 to 100 μm is thereafter grown on the P type substrate 51.

Step 3

Figure 3C:
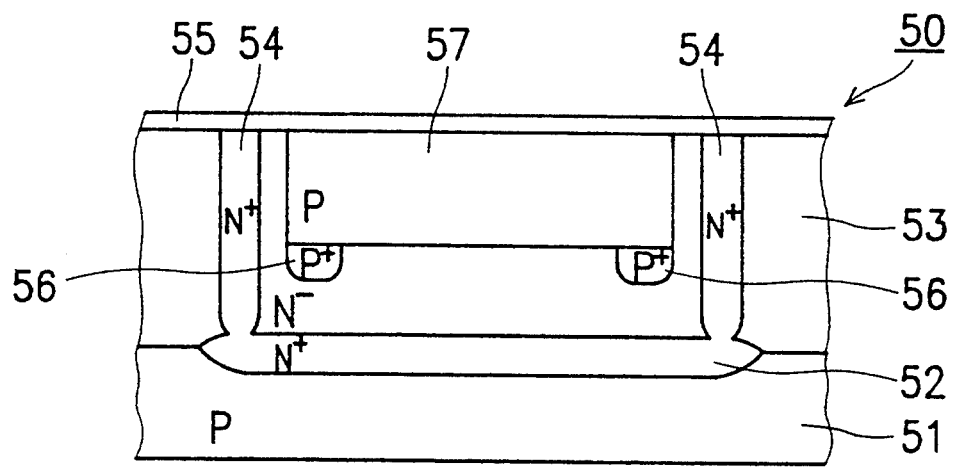

FIG. 3c illustrates that N type impurities are then implanted into the N−epitaxial layer 53 at a predetermined sinker position to form a sinker 54 in connection with the buried layer 52. The sinker 54 functions as a drain electrode. The buried layer 52 and the sinker 54 define an active region within which a VDMOS transistor may be built. The following steps are similar to the corresponding process of the first embodiment.

An oxide mask layer 55 is first formed, patterned and then boron (B$^{11}$) ions are implanted with a dosage between $5 \times 10^{13}$ to $1 \times 10^{16}$ atoms/cm² at a predetermined implantation region position to form a P+ region 56. Next, a portion of the oxide layer on the active region is etched, and boron ions are implanted into the active region with a dosage of $1 \times 10^{13}$ to $1 \times 10^{14}$ atoms/cm² to form a P type body region 57.

Step 4

Figure 3D:
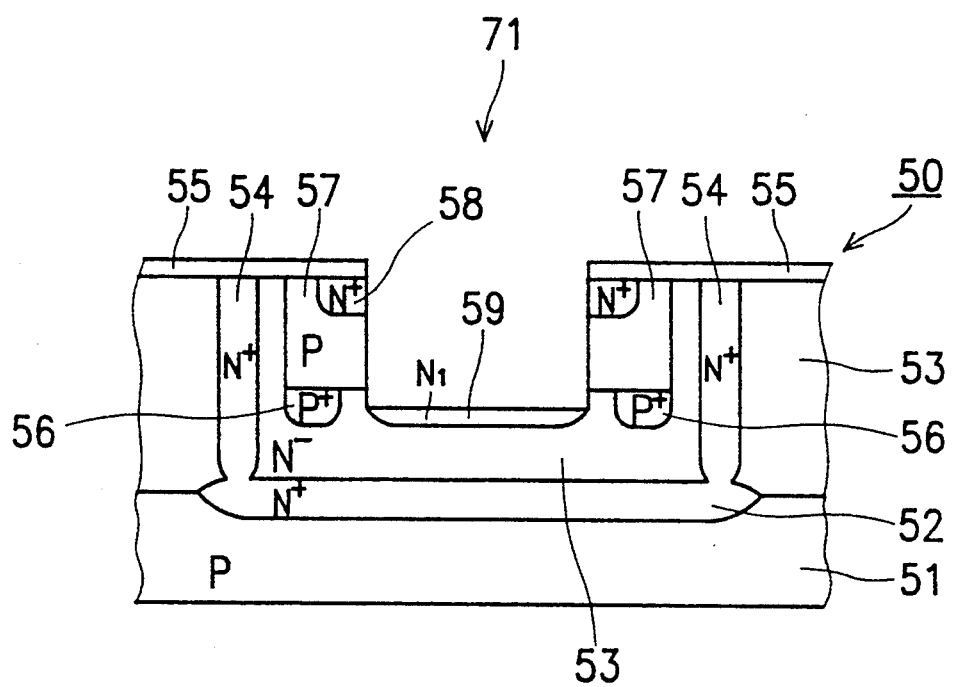

The substrate is then heated and the body region 57 is diffused to a depth of 3 to 4 μm in the N− epitaxial layer 53 with another oxide layer 55 being formed simultaneously. As is shown in FIG. 3d, a source electrode 58 is then formed by removing a portion of the oxide layer on the source electrode 58 using a conventional lithographic technique and implanting phosphorus (p³¹) ions or arsenic ions into the body region 57 with a dosage of $1 \times 10^{15}$ to $1 \times 10^{16}$ atoms/cm². The substrate is again heated to diffuse the source electrode 58 to a depth of 1 to 2 μm in the body region 57 and an oxide layer is grown on the source electrode 58. A trench 71 is then formed by conventional lithographic techniques using a trench mask and RIE to etch into the N− epitaxial layer 53. Thereafter, phosphorus (p³¹) ions or arsenic ions are implanted into the bottom of the trench 71 to form a first N type implanted region 59. The doping density of the first N type implanted region 59 is higher than the doping density of the N− epitaxial layer 53.

Step 5

Figure 3E:
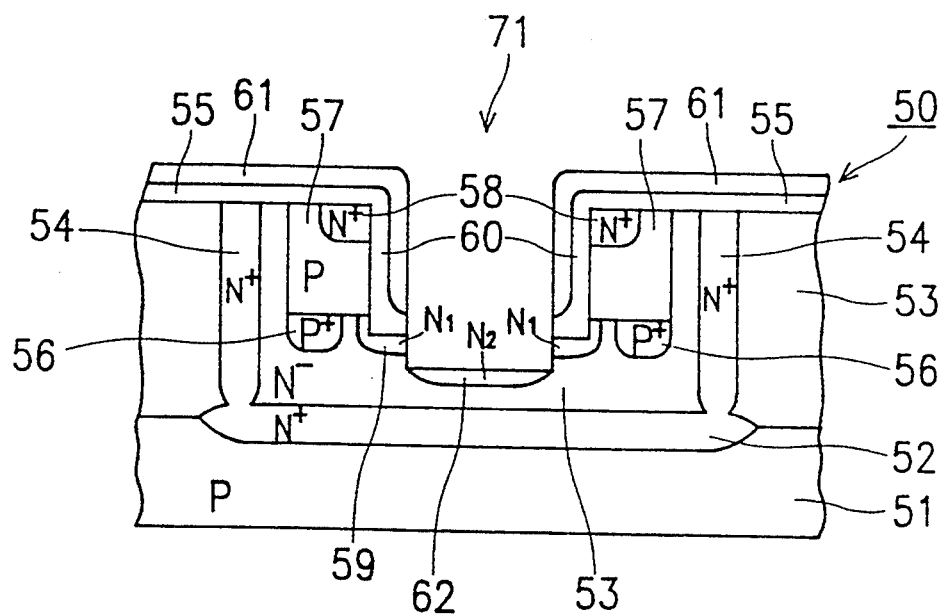

As is shown in FIG. 3e, the substrate is then heated to grow a first gate oxide layer 60 and to drive in the phosphorus or arsenic ions. The substrate is then annealed. A silicon nitride layer 61 is thereafter deposited on the gate oxide layer 60 by chemical vapor deposition (CVD). After the aforementioned steps, the bottom of the trench 71 is further deepened using RIE, and then implanted with phosphorus (p³¹) ions or arsenic (As⁵¹) ions to form a second N type implanted region 62. The doping density of the second N type implanted region 62 is higher than the doping density of the first N type implanted region 59. The doping density of the second N type implanted region 62 is lower than the doping density of the N+ substrate 51.

Step 6

Figure 3F:
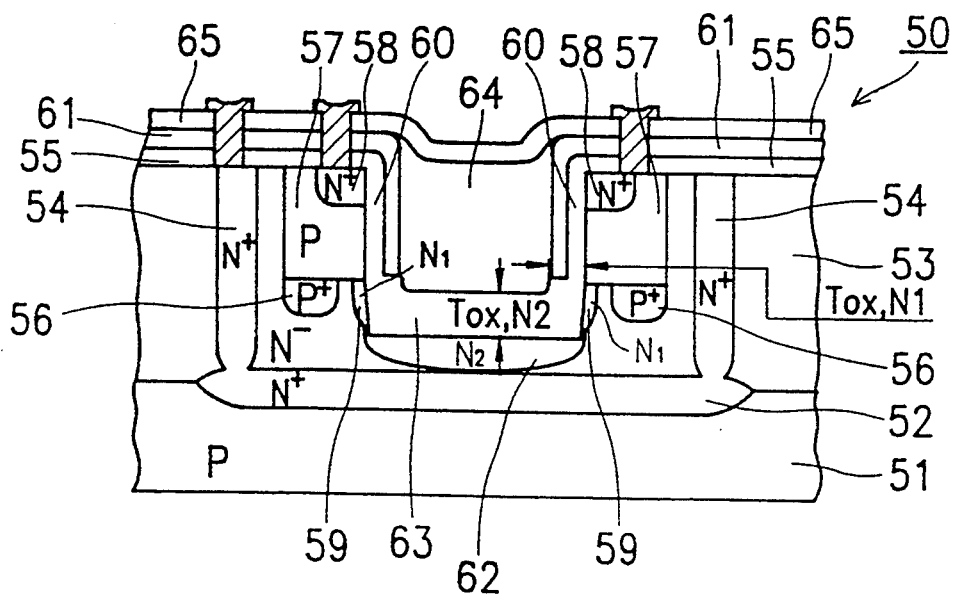
Figure 4A:
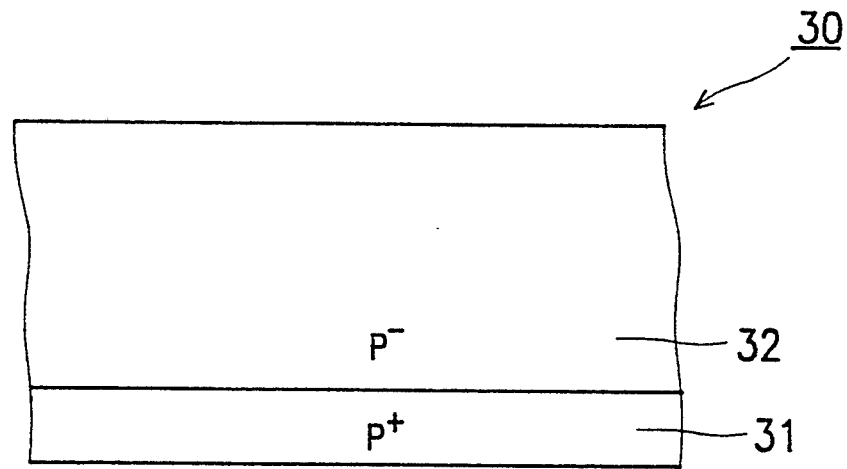
FIGS. 4a to 4l are cross sectional views of a third embodiment of the VDMOS transistor according to the present invention during various steps in its formation.
Figure 4B:
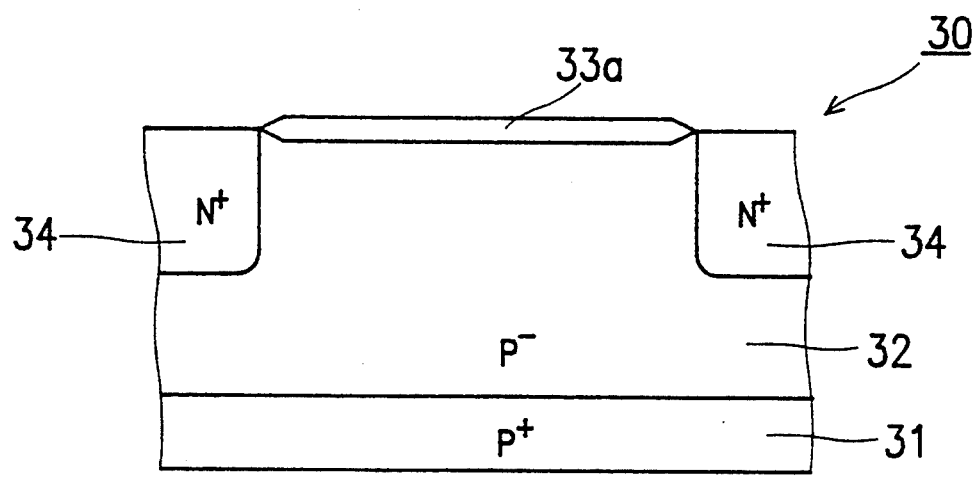
Figure 4C:
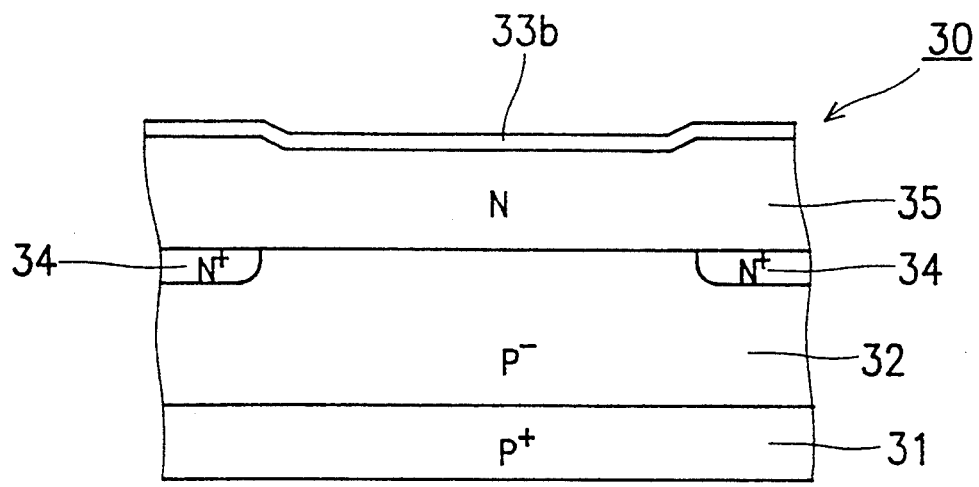
Figure 4D:
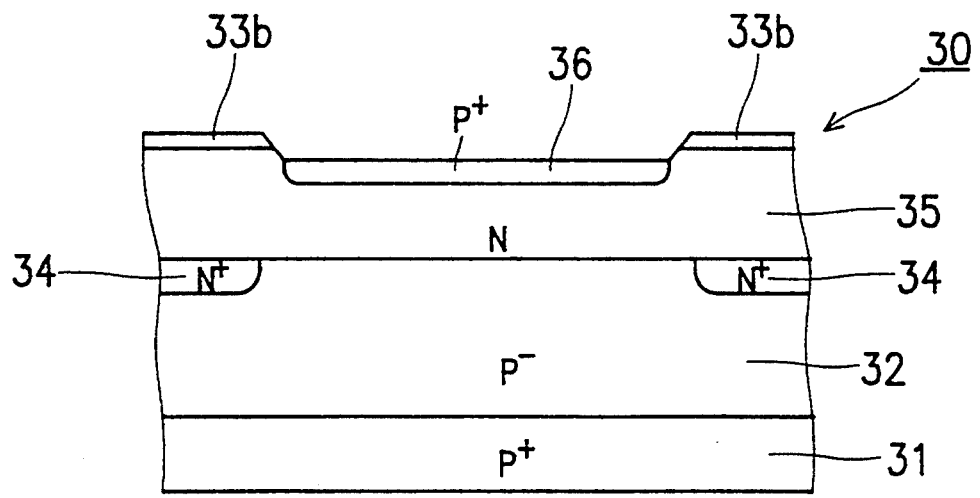
Figure 4E:
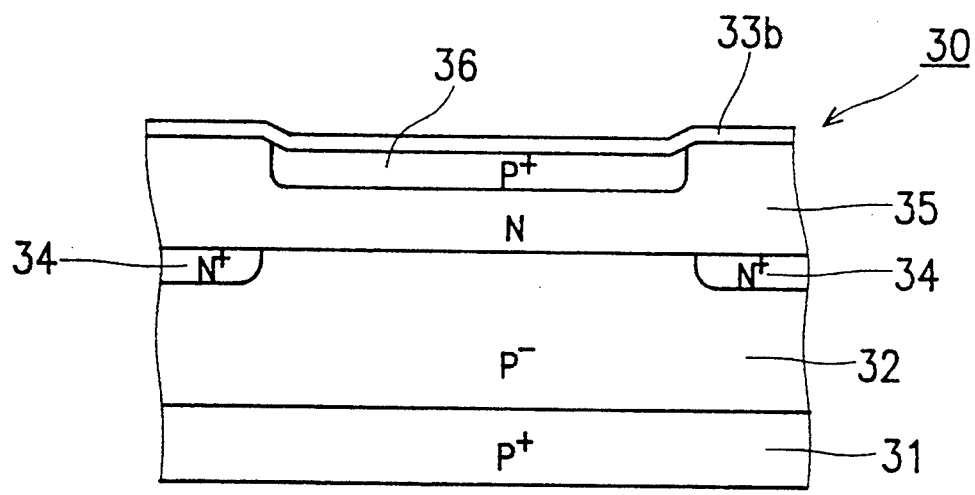
Figure 4F:
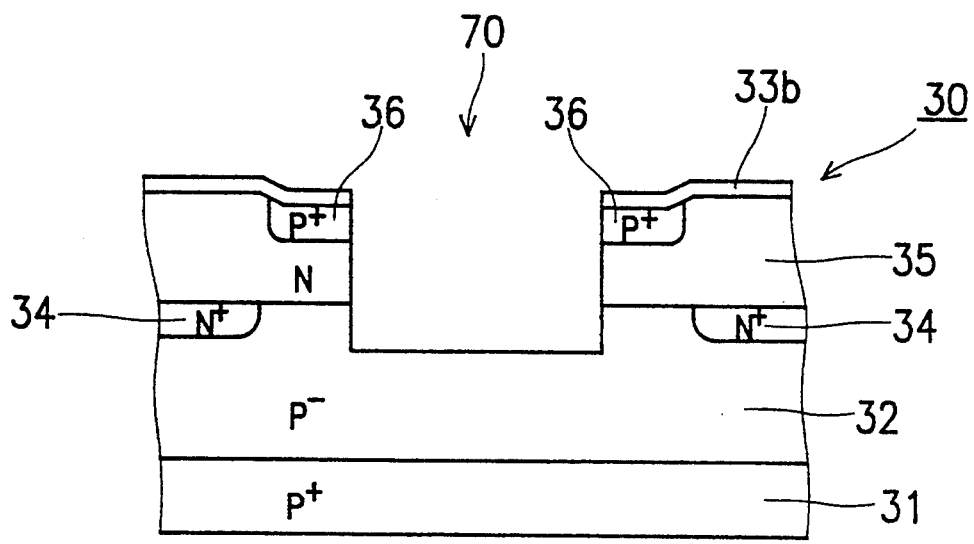
Figure 4G:
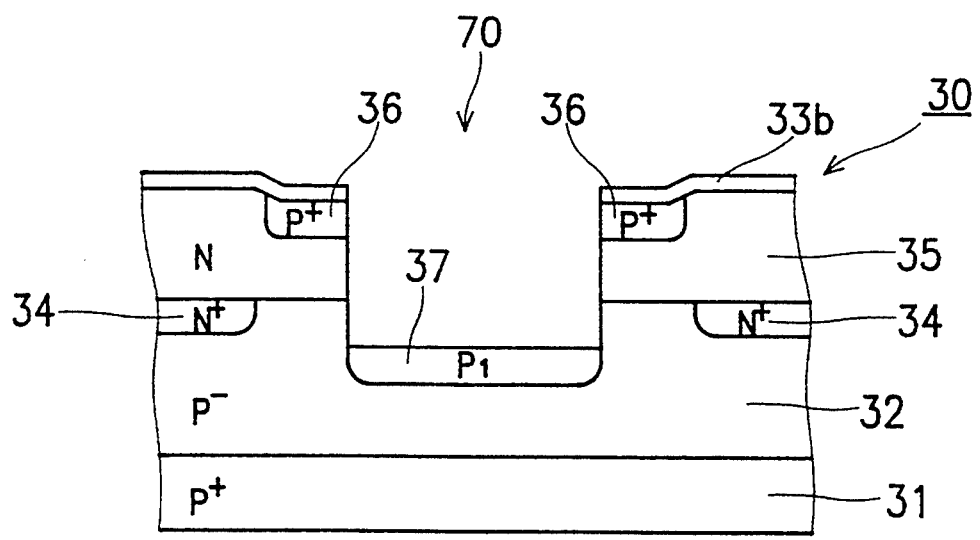
Figure 4H:
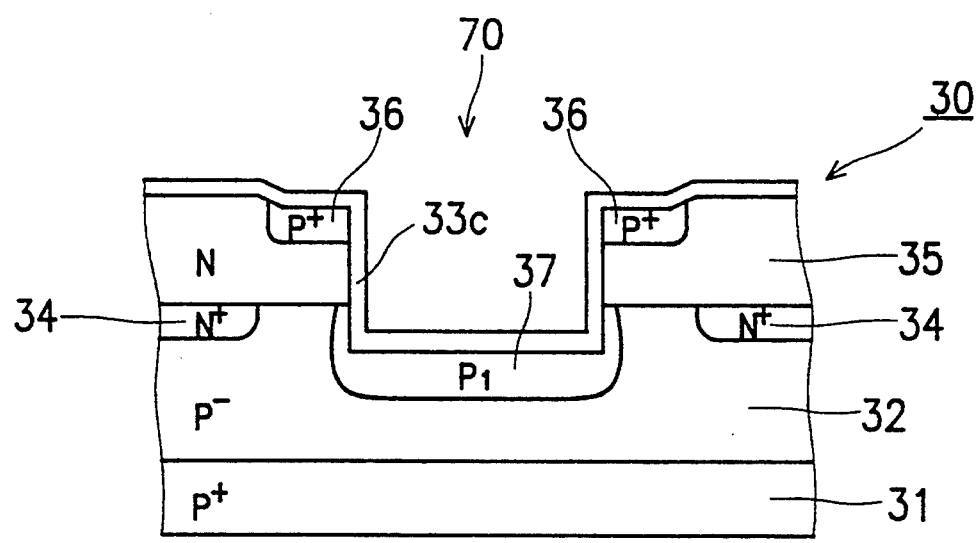
Figure 4I:
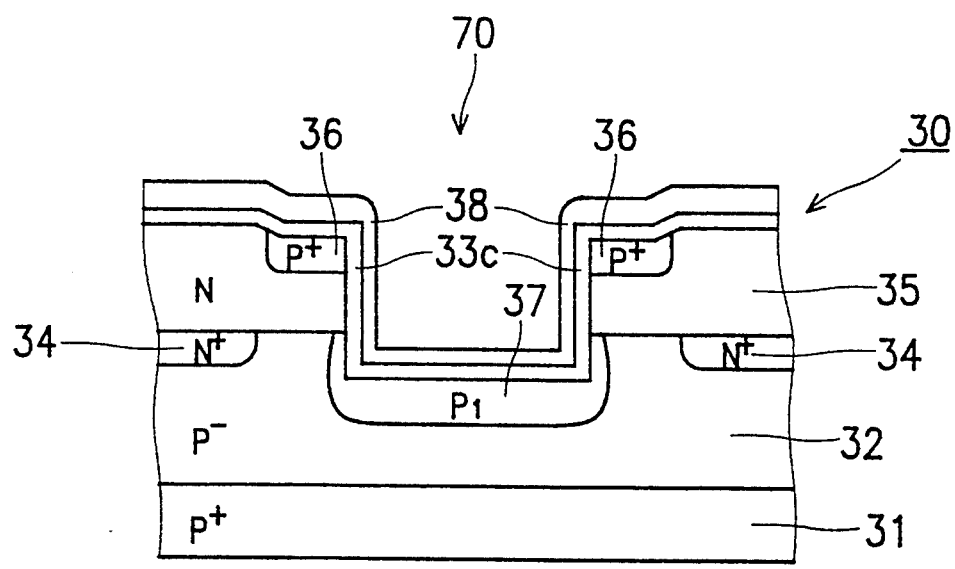
Figure 4J:
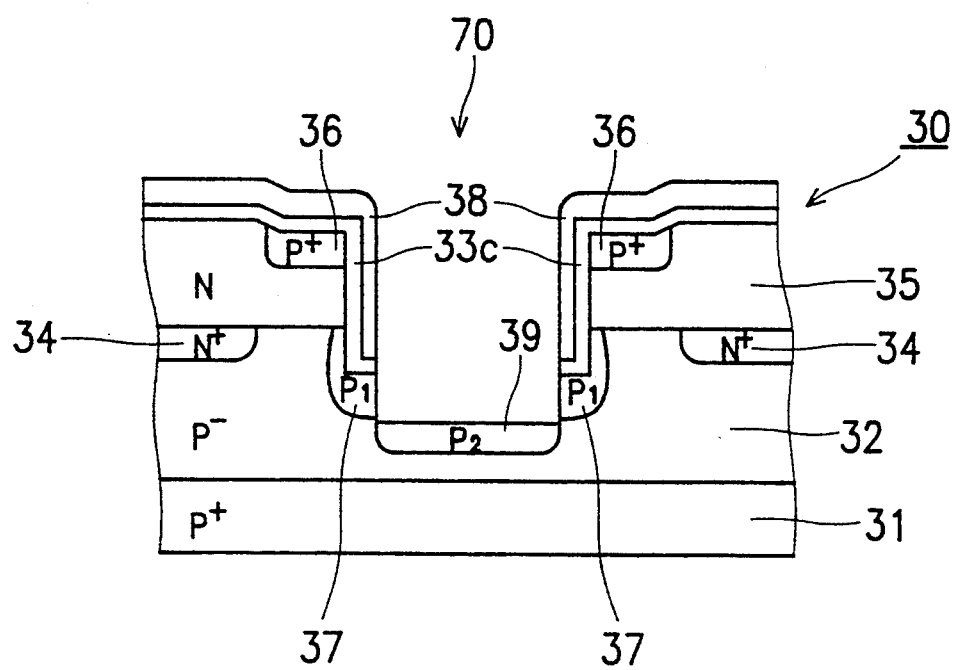
Figure 4K:
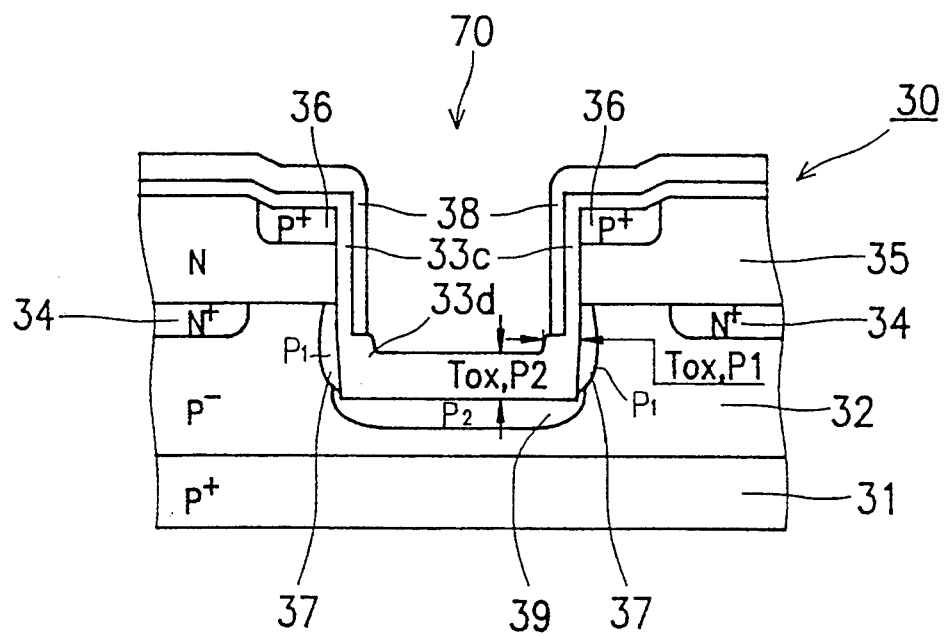
Figure 4L:
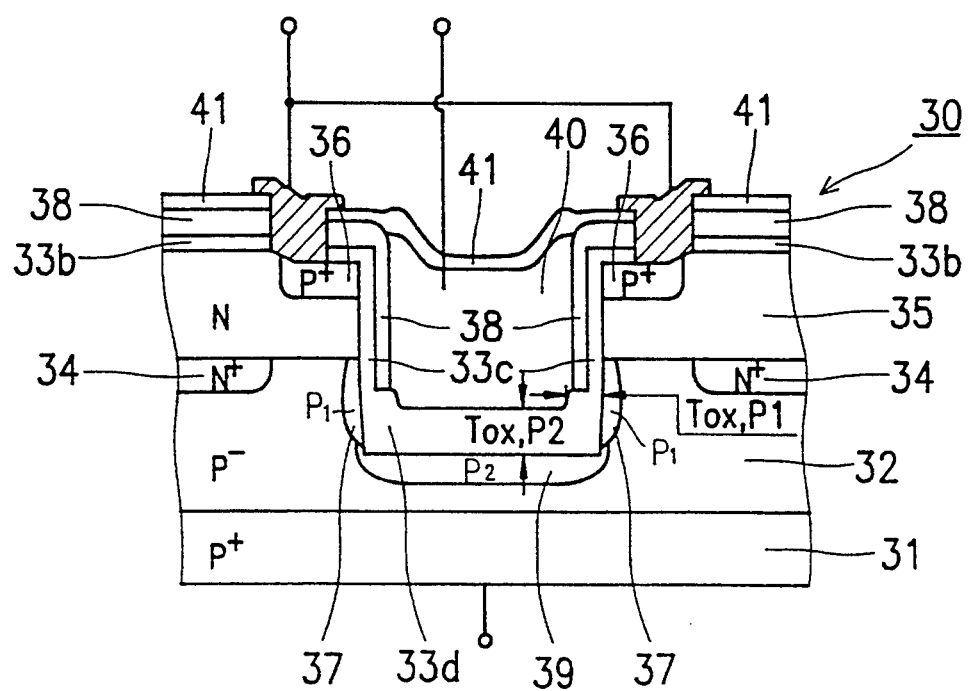
Figure 5A:
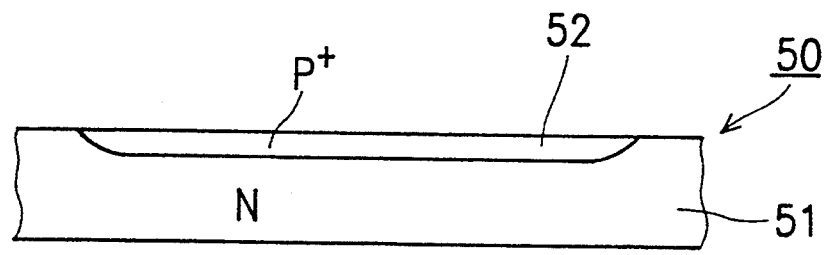
FIGS. 5a to 5f are cross-sectional views of a fourth embodiment of the VDMOS transistor according to the present invention during various stages in its formation.
Figure 5B:
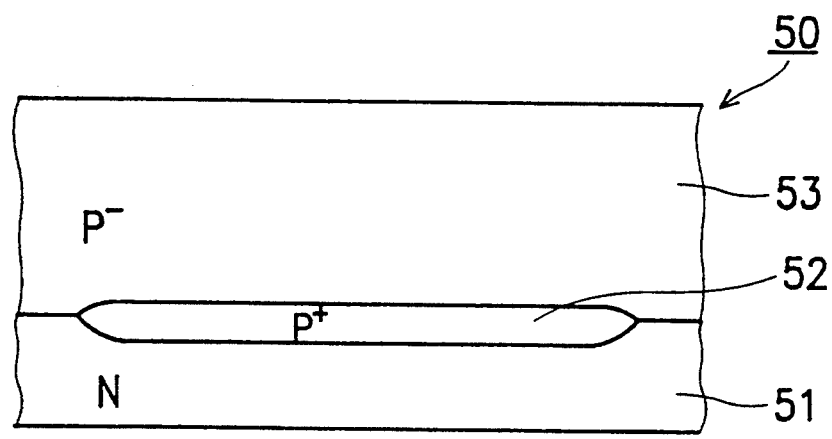
Figure 5C:
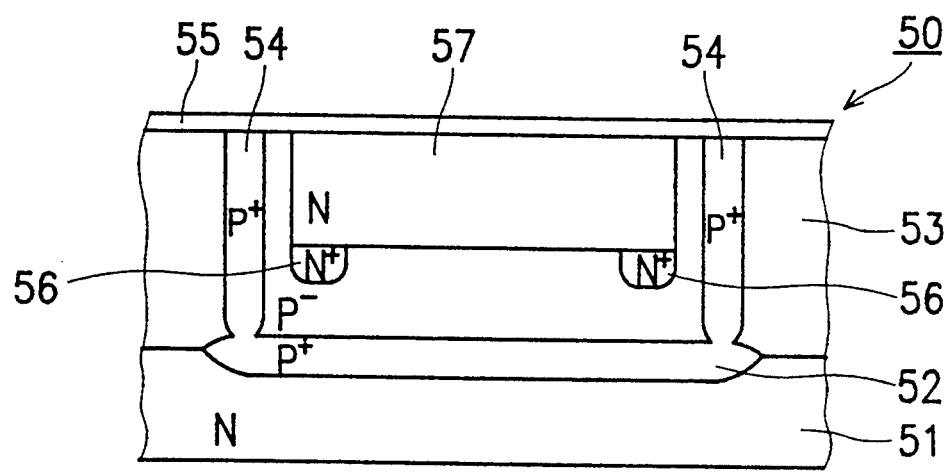
Figure 5D:
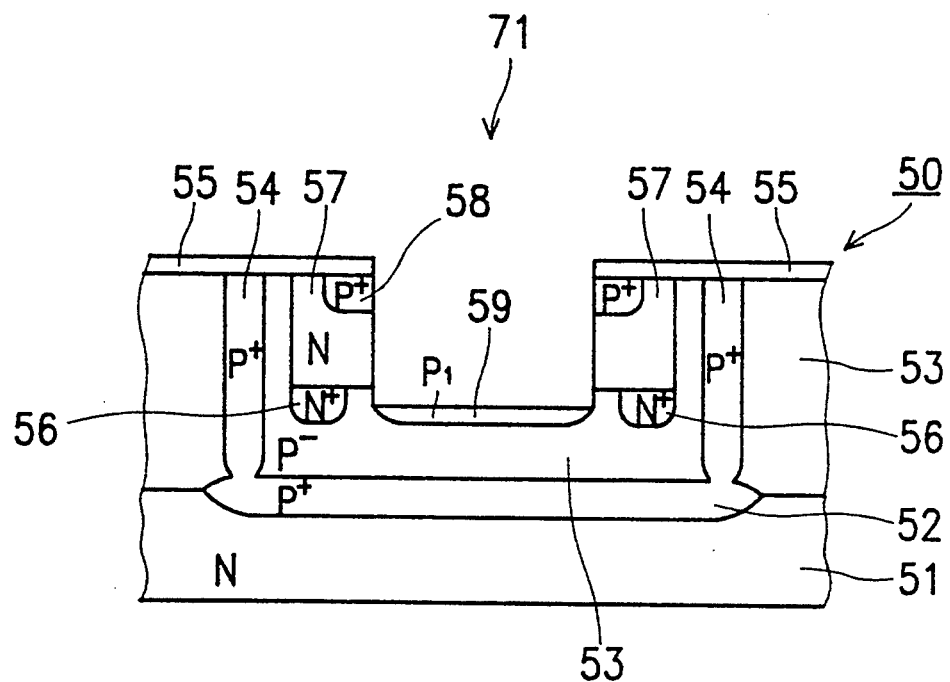
Figure 5E:
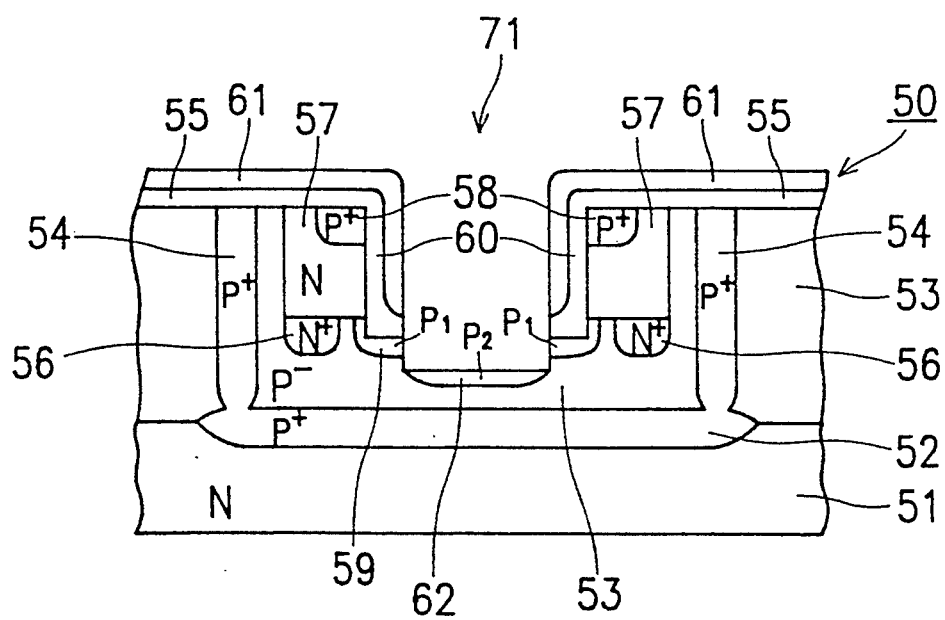
Figure 5F:
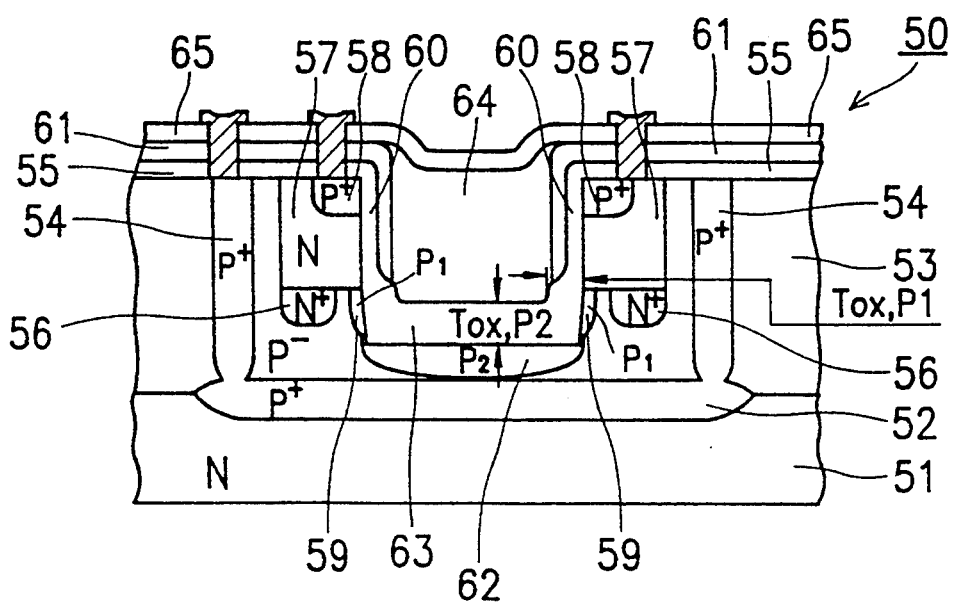

FIG. 3f shows that the substrate is then heated to form a second gate oxide layer 63 with phosphorus or arsenic ions in the second N type implanted region 62 being simultaneously diffused further into the substrate. The thickness of the second gate oxide layer 63 is greater than the thickness of the first gate oxide layer 60. Next, a poly gate 64 is formed in the trench 71 by depositing polysilicon on the substrate and then etching the portion of polysilicon that is not in the trench 71. An oxide layer 65 is then formed by CVD on the substrate. Lastly, metal vias, metal contacts and wiring are formed by conventional lithographic techniques.

The advantages of the second embodiment are similar to those of the first embodiment, and therefore are not repeated here.

In the first and second embodiments, N type impurities are implanted into the bottom of the trench twice to form two N type implanted regions. Even better performance may be achieved by forming more than two N type implanted regions. In that case, the relation between each implanted region is:

$$N- < N_1 < N_2 < \ldots < N_n < N+$$

wherein:

N− is the doping density of the N− epitaxial layer;
$N_1$ is the doping density of the first N-type implanted region;
$N_2$ is the doping density of the second N-type implanted region;
$N_n$ is the doping density of an n-th N-type implanted region; and
N+ is the doping density of the N+ substrate.

Although successively increasing densities of the respective implanted regions lower the source/drain resistance, the thickness of the corresponding gate oxide layers may be increased to compensate for the reduction in breakdown voltage which is conventionally associated with increased doping densities. The relationship between the gate oxide thicknesses corresponding to the respective implanted regions is:

$$T_{ox,N1} < T_{ox,N2} < T_{ox,N3} < \ldots < T_{ox,Nn}$$

wherein:

$T_{ox,N1}$ is the thickness of the gate oxide layer of the first N-type implanted region;
$T_{ox,N2}$ is the thickness of the gate oxide layer of the second N-type implanted region;
$T_{ox,N3}$ is the thickness of the gate oxide layer of the third N-type implanted region; and
$T_{ox,Nn}$ is the thickness of the gate oxide layer of an n-th N-type implanted region.

As may be readily appreciated, the minimum width of the trench must be increased as the number of implanted regions in the trench is increased. Furthermore, whether or not the drain electrode is electrically connected to the implanted region which is closest to the drain electrode has no effect on the advantages provided by the present invention. For example, the second implanted region 39 in the first embodiment is not connected with the drain electrode.

It should be also noted that the present invention is applicable to either PMOS or NMOS as shown in FIGS. 4a to 4l and FIGS. 5a to 5f. Since the interchange of P type and N type is well known to those skilled in the art, it is not further discussed hereinafter, except and insofar as the foregoing relationships are equally applicable to both P type and N type. Ergo, the relation between the doping densities of each implanted region may be more generally described as:

$$D- < D_1 < D_2 < \ldots < D_n < D+$$

wherein:

D− is the doping density of the D− epitaxial layer:
$D_1$ is the doping density of the first D-type implanted region:
$D_2$ is the doping density of the second D-type implanted region;
$D_n$ is the doping density of the n-th D-type implanted region; and
D+ is the doping density of the D+ substrate.

Similarly, the relationship between the gate oxide thicknesses corresponding to the respective implanted regions may be more generally stated as:

$$T_{ox,D1} < T_{ox,D2} < T_{ox,D3} < \ldots < T_{ox,Dn}$$

wherein:

$T_{ox,D1}$ is the thickness of the gate oxide layer of the first D-type implanted region;

$T_{ox,D2}$ is the thickness of the gate oxide layer of the second D-type implanted region;

$T_{ox,D3}$ is the thickness of the gate oxide layer of the third D-type implanted region; and $T_{ox,Dn}$ is the thickness of the gate oxide layer of the n-th D-type implanted region.

While the invention has been described by way of examples and in terms of several preferred embodiments, it is to be understood that the invention need not be limited to the disclosed embodiments. On the contrary, the disclosed invention is intended to cover various modifications and similar arrangements within the spirit and scope of the appended claims, the scope of which should be accorded the broadest interpretation so as to encompass all such modifications and similar structures.

What is claimed is:

1. A VDMOS transistor on a semiconductor substrate, comprising:

a drain electrode region of a first conductivity type in said substrate, said drain electrode region having a drain electrode region doping density (D+);

an epitaxial layer of said first conductivity type formed on said drain electrode region, said epitaxial layer having an epitaxial layer doping density (D−), said epitaxial layer defining a first trench and a deeper and narrower second trench within said first trench, said epitaxial layer including a first implanted region of said first conductivity type adjoining said first trench and a second implanted region of said first conductivity type adjoining said second trench, said first and said second implanted regions having a first and a second implanted region doping density ($D_1$), ($D_2$), respectively;

a first gate oxide layer formed within said first trench adjacent to said first implanted region, said first gate oxide layer having a first gate oxide layer thickness ($T_{OX,D1}$); and a second gate oxide layer formed within said second trench adjacent to said second implanted region, said second gate oxide layer having a second gate oxide layer thickness ($T_{OX,D2}$), wherein:

$$D- < D_1 < D_2 < D+;$$

and $$T_{OX,D1} < T_{OX,D2}.$$

2. The VDMOS transistor of claim 1, wherein said first conductivity type is N type.

3. The VDMOS transistor of claim 1, wherein said first conductivity type is P type.

4. The VDMOS transistor of claim 1, wherein said drain electrode region has a coefficient of drain electrode region electrical resistance between 0.005 and 0.1 $\Omega$-cm.

5. The VDMOS transistor of claim 1, wherein said epitaxial layer has a coefficient of epitaxial layer electrical resistance between 0.1 and 100 $\Omega$-cm and an epitaxial layer thickness between 8 and 100 $\mu$m.

* * * * *